(12) United States Patent
Nakayama et al.

(10) Patent No.: US 7,999,644 B2
(45) Date of Patent: Aug. 16, 2011

(54) SWITCH

(75) Inventors: Teruyuki Nakayama, Kusatsu (JP);
Minoru Hashimoto, Ritto (JP);
Takahiro Ide, Takeo (JP); Tsuyoshi Makigawa, Karatsu (JP)

(73) Assignee: Omron Corporation, Kyoto (JP)

( * ) Notice: Subject to any disclaimer, the term of this patent is extended or adjusted under 35 U.S.C. 154(b) by 189 days.

(21) Appl. No.: 12/046,901

(22) Filed: Mar. 12, 2008

(65) Prior Publication Data
US 2008/0224803 A1     Sep. 18, 2008

(30) Foreign Application Priority Data
Mar. 13, 2007  (JP) ................ P2007-063089

(51) Int. Cl.
*H01H 36/00* (2006.01)

(52) U.S. Cl. ......... 335/207; 335/161; 335/206; 340/547

(58) Field of Classification Search .......... 335/205–207, 335/215, 159–161, 302–306; 340/547; 324/207.21
See application file for complete search history.

(56) References Cited

U.S. PATENT DOCUMENTS

| | | | | |
|---|---|---|---|---|
| 2,912,540 A * | 11/1959 | Sawicki | ........................ | 335/161 |
| 4,210,889 A * | 7/1980 | Holce | ............................ | 335/207 |
| 4,349,814 A * | 9/1982 | Akehurst | ....................... | 335/207 |
| 4,580,062 A | 4/1986 | MacLaughlin | | |
| 4,812,674 A * | 3/1989 | Sue et al. | ....................... | 307/116 |
| 4,818,939 A * | 4/1989 | Takahashi et al. | ....... | 324/207.21 |
| 4,945,340 A * | 7/1990 | Brill | .............................. | 340/547 |
| 5,233,323 A * | 8/1993 | Burkett et al. | ................ | 335/207 |
| 5,239,202 A | 8/1993 | Hostetler | | |
| 5,541,562 A * | 7/1996 | Fletcher et al. | ............... | 335/205 |
| 6,963,281 B2 * | 11/2005 | Buckley | ........................ | 340/547 |

FOREIGN PATENT DOCUMENTS

| | | |
|---|---|---|
| DE | 101 38 342 A1 | 2/2003 |
| GB | 2 087 079 A | 5/1982 |
| JP | 2002-243404 | 8/2002 |
| JP | 2005-326058 | 11/2005 |
| WO | WO 98/17001 | 4/1998 |

OTHER PUBLICATIONS

German Examination Report on application No. 10 2008 010 226.1-56 dated Dec. 9, 2010; 5 pages (with partial English-language translation).

* cited by examiner

*Primary Examiner* — Anh T Mai
*Assistant Examiner* — Bernard Rojas
(74) *Attorney, Agent, or Firm* — Foley & Lardner LLP

(57) ABSTRACT

A central magnet of a plurality of magnets arranged to be different in polarities is detected by two hall ICs; therefore, reduction in size can be achieved by reducing the number of the magnets; and at the same time, the number of the hall ICs can be maintained and the reliability can be secured, as compared with a configuration in which the magnets and the hall ICs individually respond in one to one correspondence.

6 Claims, 5 Drawing Sheets

SWITCH

This application claims priority from Japanese Patent Application P2007-063089, filed on Mar. 13, 2007. The entire content of the aforementioned application is incorporated herein by reference.

BACKGROUND OF THE INVENTION

1. Field of the Invention

The present invention relates to switches and, more particularly, relates to a non-contact switch using a magnetic sensor.

2. Description of the Related Art

Since a non-contact switch has no mechanical contact, there is no mechanical wear between contacts and it excels in durability. Also, since abrasion powder is not produced, it is suitable for application in foods and semiconductors. For example, in Japanese Unexamined Patent Publication No. 2005-326058, there is disclosed a door switch in which opening and closing of a commercial refrigerator door to be frequently opened and closed is detected by approach and separation of a magnet and a hall IC.

In the case where a non-contact switch is used as a door switch for a safety door which is for entering to and exiting from a work area where mechanical appliances such as industrial robots are surrounded by a safety fence, high reliability is required.

FIG. 7 shows a schematic configuration diagram of the non-contact switch suitable for the door switch for such safety door.

A non-contact switch 20 includes, for example, an actuator 21 serving as an operating member mounted on the door side to be opened and closed, and a switch body 22 which is mounted on the fixed frame side of the door and detects approach and separation of the actuator 21, that is, opening and closing of the door.

A plurality of magnets, four magnets 23-1 to 23-4 in this case, are arranged and incorporated in the actuator 21 along a longitudinal direction of a case 24; whereas, four hall ICs 25-1 to 25-4 serving as magnetic sensors are arranged and incorporated in the switch body 22 along the longitudinal direction of a case 26 so as to be opposed in a closed state of the door individually in response to the respective magnets 23-1 to 23-4. The four magnets 23-1 to 23-4 of the actuator 21 are arranged so as to be alternately different polarities between the neighboring magnets; whereas, the four hall ICs 25-1 to 254 of the switch body 22 are arranged so as to be respectively opposed to magnetic poles of one side of the respective magnets 23-1 to 23-4 in response to the polarities of the magnets 23-1 to 23-4 to be objects for detection. The respective hall ICs 25-1 to 254 give a detection output when the magnets 23-1 to 23-4 to be objects for detection are approached and entered to a detection region.

In such non-contact switch 20, it is regarded as that the door is closed when the approach of the four magnets 23-1 to 23-4 with different polarities arranged in a predetermined order is detected by the respective four hall ICs 25-1 to 254, that is, when the magnets 23-1 to 234 of corresponding polarities are detected by all four hall ICs 25-1 to 254; and a safety output with a high level is given to a higher safety controller. Then, it is regarded as that the door is not closed when the magnets 23-1 to 23-4 are not detected by any one of the hall ICs 25-1 to 25-4; and the safety output with the high level is not outputted.

The higher safety controller supplies power to mechanical appliances and drives the same only when the safety door is closed and the safety output with the high level is given from the non-contact switch 20 to the mechanical appliances arranged in a work area surrounded by the safety door and the safety fence and safety is secured.

In the non-contact switch 20 having the above configuration, for example, even if the switch 20 is tried to be nullified by approaching mere magnets to the switch body 22, magnetic fields of different polarities of a predetermined order cannot be detected by the four hall ICs 25-1 to 25-4; therefore, it is regarded as that the door is not closed, and the safety output is not outputted; and consequently, the mechanical appliances are not operated, and safety is secured.

In this manner, the plurality of the magnets 23-1 to 234 and the plurality of the hall ICs 25-1 to 25-4 are arranged and incorporated in the predetermined order in the actuator 21 and the switch body 22, respectively; and the safety output is not outputted unless the approach of the magnets 23-1 to 234 of corresponding polarities is detected by all the hall ICs 25-1 to 25-4 to enhance the reliability. However, the plurality of the magnets 23-1 to 23-4 and the plurality of the hall ICs 25-1 to 25-4 need to be arranged and incorporated in the cases 24 and 26; and therefore, reduction in size of the non-contact switch 20 is difficult.

That is, as compared with the case where magnetic lines of force of a single magnet 30 is detected by a hall IC 31 as shown in FIG. 8A, when the plurality of the magnets 30-1 and 30-2 are arranged, a reaching distance of magnetic lines of force is shortened as shown in FIG. 8B; and therefore, the narrower an interval of the plurality of the magnets 30-1 and 30-2 becomes, the shorter the reaching distance becomes. Therefore, in order to detect the approach of the magnets 30-1 and 30-2 in a constant detection distance by the hall ICs 31-1 and 31-2, the interval between the neighboring magnets 30-1 and 30-2 need to be above a certain level; and therefore, there is a limit to reduce the size in the arranged direction of the plurality of the magnets 23-1 to 234 and the plurality of the hall ICs 25-1 to 25-4.

The present invention has been made in view of the foregoing, and an object of the present invention is to provide a non-contact switch capable of reducing the size while securing the reliability.

SUMMARY OF THE INVENTION (1) According to the present invention, a switch includes a switch body, and an operating member which is relatively approached to and separated from the switch body. The operating member is arranged and incorporated with a plurality of magnets, the plurality of the magnets being arranged to be different polarities between the neighboring magnets, and to have a magnetic pole of one side to be positioned on the side opposed to the switch body at a position being defined by the approach. The switch body is arranged and incorporated with not less than three magnetic sensors different from the number of the magnets in response to the polarities and the position of the magnets to be objects for detection. The magnetic sensors give a detection output when the magnets to be objects for detection are approached and placed in a detection region, at least one of the magnets is an object for detection of the plurality of the magnetic sensors, and a switch output is generated on the basis of the outputs of all the three magnetic sensors of not less than three.

The operating member actuates the switch body by relatively approaching to and separating from the switch body.

"The plurality of the magnets being arranged to be different polarities between neighboring the magnets, and to have a magnetic pole of one side to be positioned on the side opposed to the switch body at a position being defined by the approach" means that, at the position where the switch body and the operating member are approached, the magnetic pole of one side of each magnet is positioned on the side opposed to the switch body, and polarities of the plurality of the arranged magnets are arranged to be different between the neighboring magnets. For example, in the case where first and second magnets are arranged, if the magnetic pole of one side of the first magnet, positioned on the side opposed to the switch body, and the magnetic pole of the other side positioned on the opposite side are an N pole and an S pole, for example; the magnetic pole of one side of the neighboring second magnet, positioned on the side opposed to the switch body, and the magnetic pole of the other side positioned on the opposite side are arranged to be the S pole and the N pole.

"Arranged with magnetic sensors in response to the polarities and the position of the magnets to be objects for detection" means that the magnetic sensors are arranged so as to be able to detect approach of the magnets to be the objects for detection, and are arranged in a direction and at a position that can detect magnetic fields corresponded to polarities of the magnets to be the objects for detection.

"At least one of the magnets is an object for detection of the plurality of the magnetic sensors" means that, as for at least one of the magnets, approach of the one magnet is detected by the plurality of the magnetic sensors; and means that the approach of the same magnet is detected by the plurality of the magnetic sensors.

One set or a plurality of sets made of one magnet that is an object for detection and a plurality of magnetic sensors which detect the approach of the one magnet may be provided.

"A switch output is generated on the basis of the outputs of all the magnetic sensors" means that the switch output corresponding to approach and separation of the switch body and the operating member, for example, the switch output with a high level or a low level is generated on the basis of not less than all three magnetic sensors; and when the approach of corresponding objects for detection is detected respectively by all magnetic sensors, and a detection output is given from all the magnetic sensors, it is preferable to generate a switch output corresponding to the approach of the switch body and the operating member.

According to the switch of the present invention, at least one magnet of the plurality of the magnets arranged so as to be different polarities is the object for detection of the plurality of the magnetic sensors; therefore, it becomes possible to reduce the number of the magnets and to achieve reduction in size, as compared with the configuration in which the magnets and the magnetic sensors individually respond in one to one correspondence; and at the same time, the number of the magnetic sensors for generating the switch output can be maintained, accordingly, the reliability can be secured while achieving reduction in size.

(2) According to one embodiment of the present invention, the switch may be such that the at least one of the magnets is the object for detection of two pieces of the magnetic sensors; and the switch output indicating that the switch body and the operating member are approached is generated when the detection output is given from all the magnetic sensors.

According to the embodiment, the approach of one magnet is detected by two magnetic sensors; therefore, at least one magnet can be reduced as compared with the configuration in which the magnets and the magnetic sensors individually respond in one to one correspondence; and the switch output indicating the approach of the operating member and the switch body is generated when all the magnetic sensors detect the approach of the magnet; therefore, the switch output with high reliability can be obtained.

(3) In the above embodiment (2), the switch may be such that the magnets of odd number in quantity are arranged in line at equally spaced intervals along a longitudinal direction of the operating member; and a magnet other than magnets at both ends of the longitudinal direction of the magnets of the odd number in quantity, and a central magnet and/or a symmetrically positioned magnet with respect to the central magnet is the object for detection of the two pieces of the magnetic sensors.

According to the embodiment, the magnet at the central position of the magnets of odd number in quantity arranged at equally spaced intervals along the longitudinal direction of the operating member and/or the symmetrically positioned magnet with respect to the centrally positioned magnet is detected by two magnetic sensors; and therefore, the magnets of odd number in quantity can be symmetrically arranged with respect to the centrally positioned magnet, and the magnetic sensors in the switch body can also be symmetrically arranged in response to the magnets. For example, the approach of the corresponding magnets can be detected even if the switch body is mounted with the both ends of the longitudinal direction reversely positioned.

(4) In the above embodiment (3), the switch may be such that the operating member is incorporated with three pieces of the magnets; the switch body is incorporated with four pieces of the magnetic sensors; and a centrally positioned magnet of the three pieces of the magnets is the object for detection of the two pieces of the magnetic sensors.

According to the embodiment, the approach of the three magnets arranged so as to be different in polarity can be detected by the four magnetic sensors; therefore, one magnet can be reduced and reduction in size can be achieved, as compared with the configuration in which the magnets and the magnetic sensors individually respond in one to one correspondence; and at the same time, similarly to the configuration individually responding in one to one correspondence, the approach of the magnets having different polarities is detected by the four magnetic sensors respectively; therefore, the reliability can be secured.

(5) According to another embodiment of the present invention, the switch may be such that the operating member is mounted on the door side to be opened and closed, and the switch body is mounted on the fixed frame side of the door.

According to the embodiment, it is possible to suitably implement as a door switch.

As mentioned above, according to the present invention, at least one magnet of the plurality of the magnets arranged so as to be different polarities is detected by the plurality of the magnetic sensors; therefore, it becomes possible to reduce the number of the magnets and to achieve reduction in size, as compared with the configuration in which the magnets and the magnetic sensors individually respond in one to one correspondence; and at the same time, the number of the magnetic sensors can be maintained, and the reliability can be secured.

DETAILED DESCRIPTION OF THE PREFERRED EMBODIMENTS

Preferred embodiments of the present invention will be described in detail below with reference to the drawings.

Figure 1:
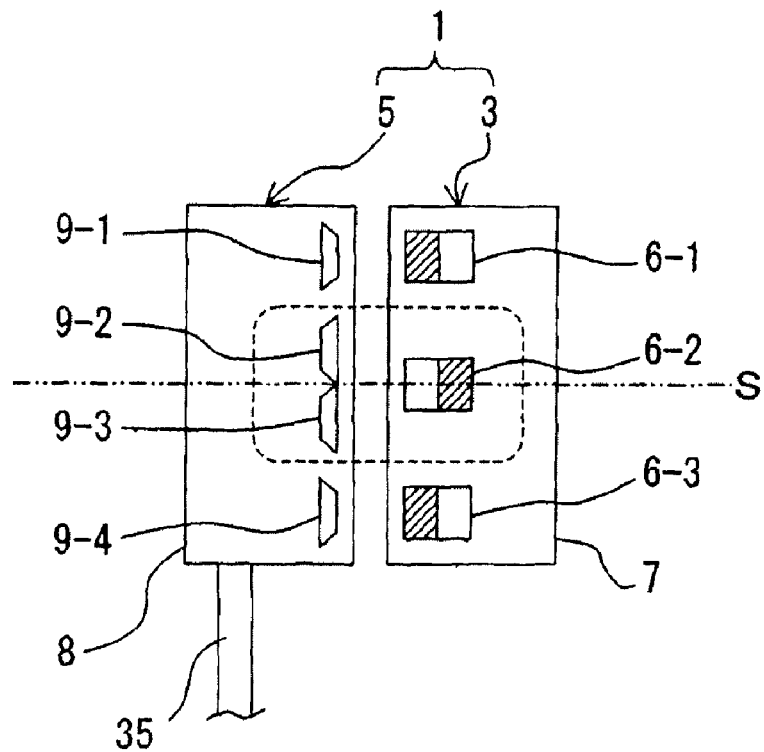
FIG. 1 shows a schematic configuration view of a switch according to one preferred embodiment of the present invention.

FIG. 1 shows a schematic configuration view of a non-contact switch according to one preferred embodiment of the present invention.

Figure 2:
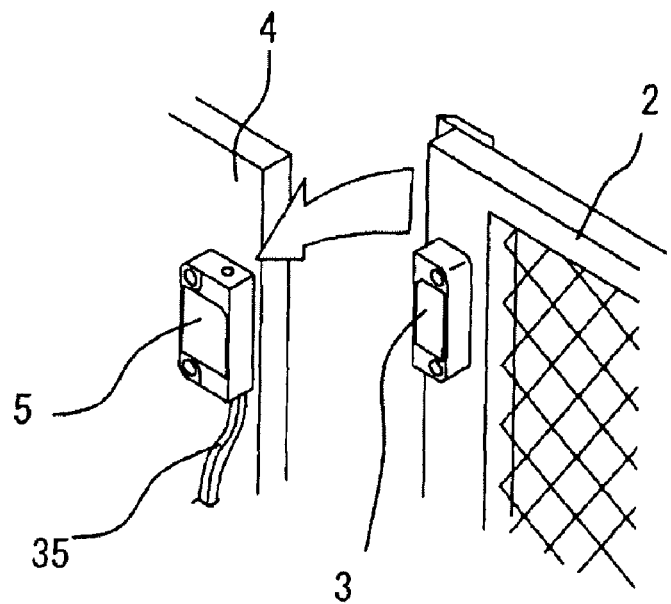
FIG. 2 shows a perspective view of a mounting state of the switch shown in FIG. 1.

A switch 1 is one used as a door switch for a safety door shown in FIG. 2, for example; and the switch 1 includes an actuator 3 serving as an operating member which is mounted on the side of a door 2 to be opened and closed as shown by an arrow mark, and a switch body 5 which is mounted on the side of a fixing frame 4 of the door and detects approach and separation of the actuator 3, that is, opening and closing of the door 2.

In the preferred embodiment, three magnets 6-1 to 6-3 are arranged and incorporated in a case 7 of the actuator 3, the magnets 6-1 to 6-3 being arranged in line at equally spaced intervals along a longitudinal direction (vertical direction in the drawing) of the case 7, as shown in FIG. 1.

The respective magnets 6-1 to 6-3 are arranged so that magnetic poles of one side are positioned on the side opposed to the switch body 5 at a position where the actuator 3 is approached to the switch body 5, and magnetic poles of the other side are positioned on the opposite side respectively; and polarities are arranged to be alternately different between the neighboring magnets.

For example, in the case of the first magnet 6-1, the magnetic pole of one side positioned on the side opposed to the switch body 5 is an N pole, and the magnetic pole of the other side is an S pole; in the case of the second magnet 6-2, the magnetic pole of one side is the S pole, and the magnetic pole of the other side is the N pole; and in the case of the third magnet 6-3, the magnetic pole of one side is the N pole, and the magnetic pole of the other side is the S pole.

On the other hand, hall ICs 9-1 to 9-4 serving as four magnetic sensors are arranged and incorporated in a case 8 of the switch body 5, the hall ICs 9-1 to 9-4 being arranged in line along a longitudinal direction (vertical direction in the drawing) of the case 8.

The hall ICs 9-1 to 94 are more in number by one than the magnets 6-1 to 6-3 and are arranged so that first and fourth hall ICs 9-1 and 9-4 at both ends individually correspond to first and third magnets 6-1 and 6-3 and second and third hall ICs 9-2 and 9-3 correspond to a second magnet 6-2.

That is, the first and the fourth hall ICs 9-1 and 9-4 detect approach of the first and the third magnets 6-1 and 6-3 serving as objects for detection respectively; and the respective hall ICs 9-1 and 9-4 are arranged so as to be opposed to the magnetic poles of one side of the respective magnets 6-1 and 6-3 in response to the polarities of the respective magnets 6-1 and 6-3 at a position where the actuator 3 is approached to the switch body 5.

Furthermore, the second and the third hall ICs 9-2 and 9-3 detect approach of the second magnet 6-2 that is the same magnet serving as an object for detection; and the second and the third hall ICs 9-2 and 9-3 are approached and arranged so as to be opposed to the magnetic pole of one side of the second magnet 6-2 in response to the polarity of the second magnet 6-2.

Figure 3:
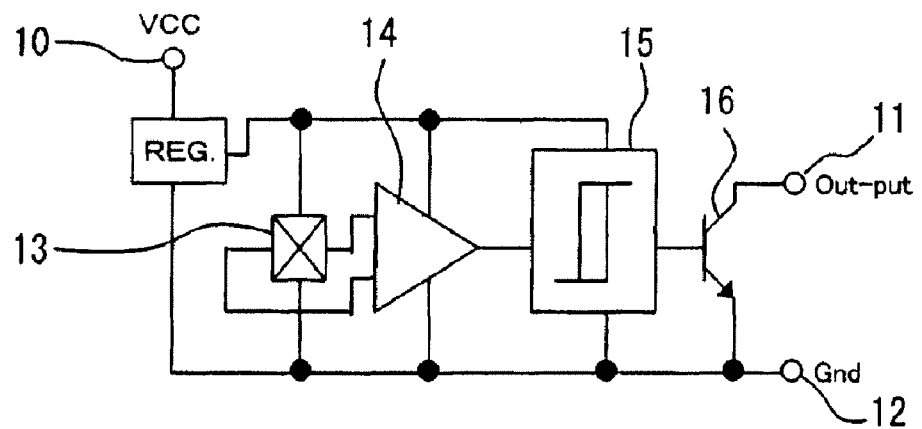
FIG. 3 shows a circuit diagram of a hall IC.

Each of the hall ICs 9-1 to 9-4 is one in which a hall element and an IC for converting an output signal of the hall element to a digital signal are packaged, which is a three terminal configuration with a power supply terminal 10, an output terminal 11, and a grounding terminal 12 as sown in FIG. 3; a hall element 13 outputs a change of magnetic flux density of an external magnetic field as a hall voltage by a Hall effect; and its hall voltage is converted to a digital signal via an amplifier 14, a Schmidt trigger 15, and an output stage 16 and is outputted from the output terminal 11. The respective hall ICs 9-1 to 9-4 give a detection output with a low level when the magnets 6-1 to 6-3 of the polarities to be objects for detection are approached and entered in a detection region and the magnetic flux density exceeds a threshold.

FIG. 3 is a block diagram of the switch body 5 of the preferred embodiment.

In the preferred embodiment, it is regarded as that the door 2 is closed when the first to the fourth all hall ICs 9-1 to 9-4 detect the approach of the magnets 6-1 to 6-3 that are objects for detection, that is, when outputs of all the hall ICs 9-1 to 9-4 become low levels; and a safety output with a high level is outputted to a higher safety controller as a switch output. Then, it is regarded as that the door 2 is not closed when the approach of the magnets 6-1 to 6-3 that are objects for detection cannot be detected by any of the hall ICs 9-1 to 9-4, and a switch output with a low level is outputted in place of the safety output with the high level.

Figure 4:
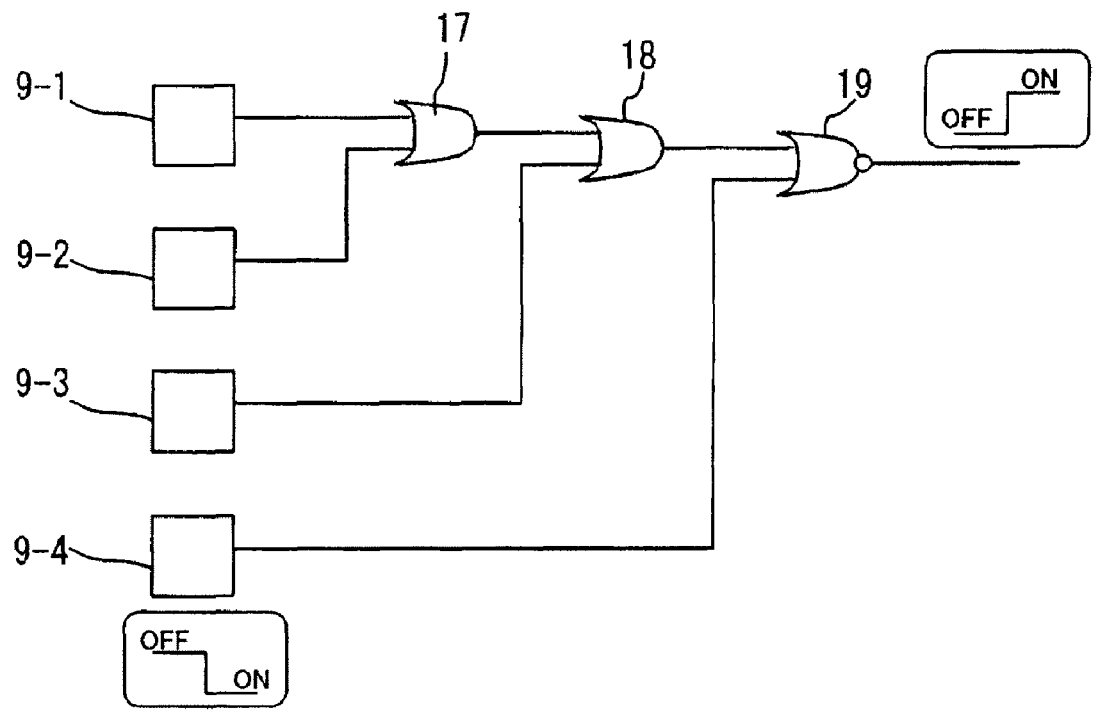
FIG. 4 shows a circuit diagram of a switch body shown in FIG. 1.

For this reason, as shown in FIG. 4, the switch body 5 includes a first OR circuit 17 to which outputs of the first and the second hall ICs 9-1 and 9-2 are given, a second OR circuit 18 to which an output of the first OR circuit 17 and an output of the third hall IC 9-3 are given, and a NOR circuit 19 to which an output of the second OR circuit 18 and an output of the fourth hall IC 9-4 are given; and an output of the NOR circuit 19 becomes the switch output.

In this manner, the safety output with the high level is not outputted as the switch output unless all the four hall ICs 9-1 to 9-4 detect the approach of the magnets 6-1 to 6-3 of the objects for detection; therefore, for example, even if it is tried to be nullified by approaching mere magnets to the switch body 5, the approaching mere magnets are not the magnets of the polarities arranged in a predetermined order; and therefore, the detection output with the low level cannot be obtained by the all hall ICs 9-1 to 94.

Figure 7:
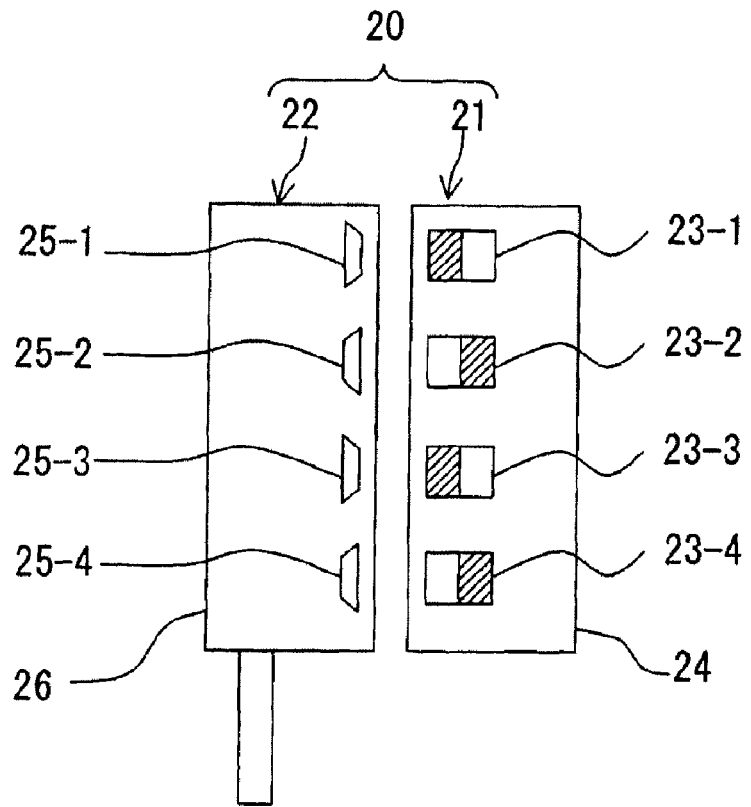
FIG. 7 shows a view of other configuration of the switch.
Figure 8A:
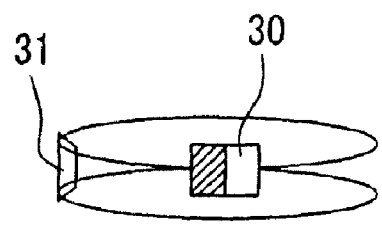
FIG. 8A and FIG. 8B show views for describing relationships between the number of magnets and detection distances.
Figure 8B:
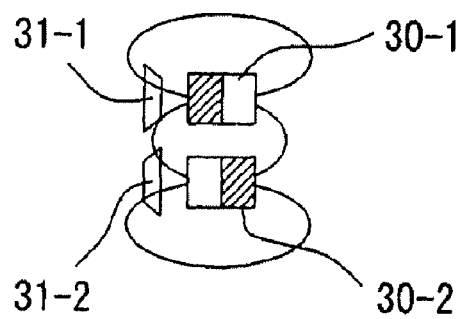

Additionally, as compared with the configuration shown in FIG. 7 in which the magnets and the hall ICs individually respond in one to one correspondence, the number of the magnets can be reduced; therefore, the size of the longitudinal direction is reduced by just that much and it becomes possible to achieve reduction in size; and it becomes possible to reduce cost. Furthermore, the number of the hall ICs can be the same and the reliability can be secured.

Figure 5:
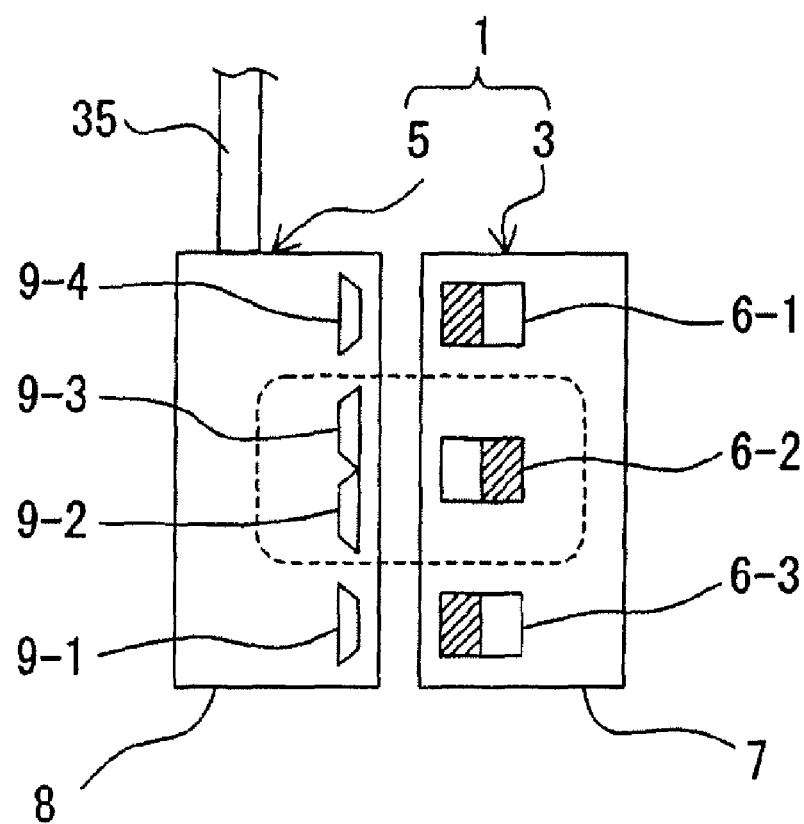
FIG. 5 shows a diagram of a state where a mounting direction of the switch body is reversed.

In addition, in the preferred embodiment, the central second magnet 6-2 of the three magnets 6-1 to 6-3 arranged in line is detected by the two hall ICs 9-2 and 9-3; and therefore, as shown in FIG. 1, at a position where the actuator 3 is approached to the switch body 5, above and below symmetrical arrangement is made at the boundary of a virtual plane S passing through the center of the second magnet 6-2. Therefore, for example, as shown in FIG. 5, even if a mounting direction of the switch body 5, that is, a drawing direction of a cord 35 is inverted, the respective hall ICs 9-1 to 94 are opposed in the same positional relation as the magnets 6-3 to 6-1 of the same polarities; and consequently, opening and closing of the door 2 can be correctly detected irrespective of normal and reverse of the mounting direction.

Figure 6A:
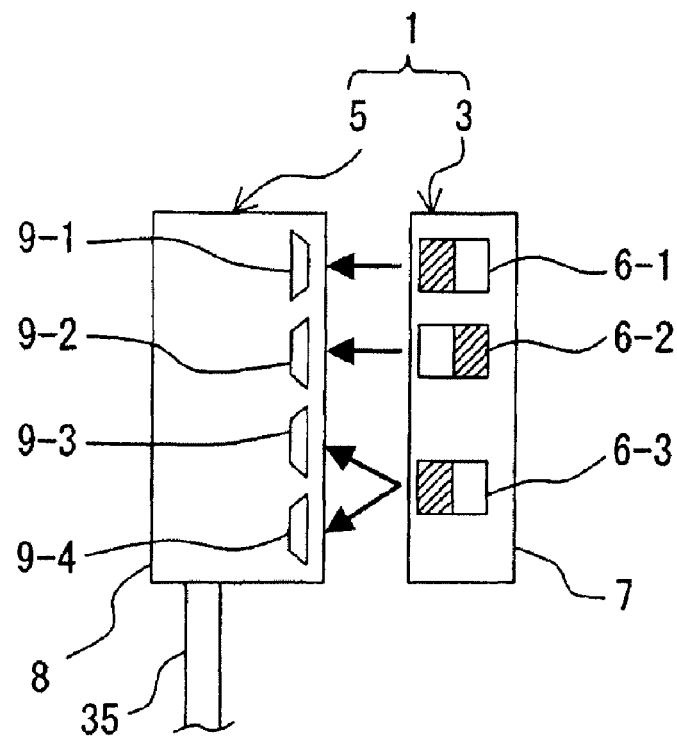
FIG. 6A and FIG. 6B show schematic configuration views of another preferred embodiment of the present invention.
Figure 6B:
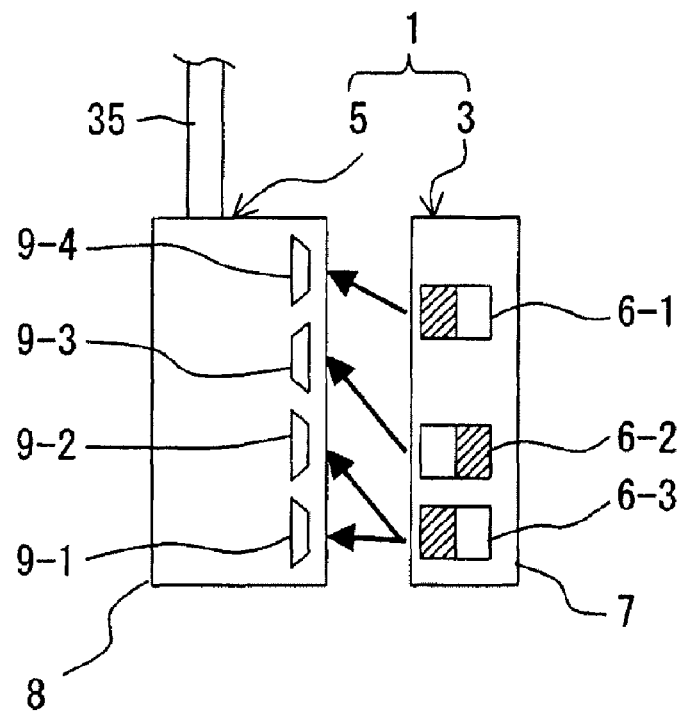

On the other hand, as shown in FIG. 6A, if the third magnet 6-3 on the one end side of the three magnets 6-1 to 6-3 arranged in line is arranged so as to be detected by the two hall ICs 9-3 and 9-4 and the size of the longitudinal direction is the same, and when the mounting direction of the switch body 5 is reversed; as shown in FIG. 6B, a deviation is generated in an opposing positional relation between the respective magnets 6-1 to 6-3 and the hall lCs 9-1 to 94, and there generates a difference in detection accuracy.

In the above described preferred embodiments, description for use in the door switches has been made; however, it will be understood that the above described preferred embodiments are not limited to the door switches, but, can be used for detection of other positions.

The present invention is useful for door switches and the like.

what is claimed is:

1. A switch comprising:
    a switch body; and
    an operating member which is separated from the switch body,
    wherein the operating member is arranged and incorporated with a plurality of magnets, the plurality of the magnets being arranged to be different polarities between neighboring of the magnets, to have a magnetic pole of one side to be positioned on the side opposed to the switch body at a position where the switch body and the operation member are approached, and to have an opposite magnetic pole to be positioned on the opposite side of the side opposed to the switch body at the position where the switch body and the operation member are approached; and
    the switch body is arranged and incorporated with not less than three magnetic sensors in response to the polarities and the position of the magnets and the number of the magnetic sensors are more than the number of the magnets, and
    wherein each of the magnetic sensors give a detection output when the magnets are approached and placed in a detection region,
    at least one of the magnets is detected by more than one of the magnetic sensors in the detection region, and
    a switch output is generated on the basis of the detection outputs of all the magnetic sensors.

2. The switch according to claim 1, wherein the at least one of the magnets is detected by two pieces of the magnetic sensors.

3. The switch according to claim 2, wherein the magnets of odd number in quantity are arranged in line at equally spaced intervals along a longitudinal direction of the operating member; and
    a central magnet and/or a symmetrically positioned magnet with respect to the central magnet other than magnets at both ends is detected by the two pieces of the magnetic sensors.

4. The switch according to claim 3, wherein the operating member is incorporated with three pieces of the magnets;
    the switch body is incorporated with four pieces of the magnetic sensors; and
    a central magnet is detected by the two pieces of the magnetic sensors.

5. The switch according to claim 1, the operating member is mounted on the door side to be opened and closed, and the switch body is mounted on the fixed frame side of the door.

6. The switch according to claim 1, wherein the magnetic sensors and the magnets are arranged such that each of the magnetic sensors detects only one of the magnets in the detection region.

* * * * *